(12) United States Patent
Ma

(10) Patent No.: US 7,264,486 B2
(45) Date of Patent: Sep. 4, 2007

(54) ELECTRICAL CONNECTOR

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/581,986

(22) Filed: Oct. 17, 2006

(65) Prior Publication Data

US 2007/0087625 A1 Apr. 19, 2007

(30) Foreign Application Priority Data

Oct. 17, 2005 (CN) ........................ 2005 1 0094921

(51) Int. Cl.
*H01R 12/00* (2006.01)
(52) U.S. Cl. ........................ 439/83; 439/862
(58) Field of Classification Search .................. 439/73, 439/862, 66, 70
See application file for complete search history.

(56) References Cited

U.S. PATENT DOCUMENTS 5,344,343 A * 9/1994 Seidler ........................ 439/876
6,099,326 A * 8/2000 Lin ............................. 439/83
6,132,222 A * 10/2000 Wang et al. .................. 439/70
6,551,112 B1 * 4/2003 Li et al. ....................... 439/66

* cited by examiner

*Primary Examiner*—Tho D. Ta
(74) *Attorney, Agent, or Firm*—Wei Te Chung

(57) ABSTRACT

An electrical connector (200) includes an insulative housing (50) defining a number of passageways (56) and a number of conductive terminals (60) residing in corresponding passageways (56), respectively. The conductive terminals (60) each include a securing portion (62) extending along a lengthwise direction of the passageways (56), a connecting portion (64) extending upwardly from the securing portion (62), a transitional portion (65) extending form the other end of the securing portion (62) towards the printed circuit board (70), a solder portion (64) formed on a distal end of the transitional portion (65). The securing portion (62) defines a wider securing surface (622). A partial projection of the transitional portion (65) projected on a plane defined by the securing surface (622) is separated an angle with a direction of the terminals (60) being inserted.

6 Claims, 10 Drawing Sheets

PROIR ART

ELECTRICAL CONNECTOR

BACKGROUND OF THE INVENTION

1. Field of the Invention

The present invention generally relates to the field of electrical connectors. And more particularly, one embodiment of the present invention relates to an electrical connector embedded with conductive terminals for connecting a chip module to a printed circuit board.

2. General Background

Electrical connectors are widely used in various computer systems for forming electrical connection between two separate electrical interfaces, such as an electronic component and a printed circuit board. Referring to FIGS. 1-3, an electrical connector 100 basically includes an insulative housing 20 defining a number of passageways 22 and a number of conductive terminals 30 residing in corresponding passageways 22, respectively. The conductive terminal 30 includes a vertical securing section 32 received in the passageway 22 of the housing 20, a connecting portion 36 extending from the securing portion 32, a tail portion 34 extending from a lower end of the securing portion 32, and a transitional portion 35 formed between the tail portion 34 and the securing portion 32. The securing portion 32 defines a securing surface 322 and the transitional portion 35 is bent in a direction vertical to the securing surface 322. The transitional portion 35 can provide the terminal 30 with an elastic flexibility in a direction vertical to the printed circuit board, thereby preventing the terminal 30 from breaking due to lack of the elastic flexibility required in the vertical direction to the printed circuit board.

However, with the development of the chip module 40 forward high density and minimized size, the arrangement of terminals 30 received in the electrical connector is more and more compact. While the terminals bear greater and more complicate force, terminals with minimized size and greater flexibility are more and more needed. In the electrical connector described in above paragraph, a centerline that the transitional portion projects on a plane defined by the securing surface is M and the direction of the terminals inserted into the housing is Y. the centerline M is parallel to the Y direction. That is to say, the transitional portion of the terminal only provides a single directional flexibility vertical to the printed circuit board, which can not meet the need of multi-directional flexibility of the terminals.

Therefore, there is a heretofore unaddressed need in the industry to address the aforementioned deficiencies and inadequacies.

SUMMARY

According to an embodiment of the present invention, an electrical connector includes an insulative housing defining a number of passageways and a number of conductive terminals residing in corresponding passageways, respectively. The conductive terminals each include a securing portion extending along a lengthwise direction of the passageways, a contacting portion extending upwardly from the securing portion, a transitional portion extending form the other end of the securing portion towards the printed circuit board, a solder portion formed on a distal end of the transitional portion. The securing portion defines a wider securing surface. Wherein a partial projection of the transitional portion projected on a plane defined by the securing surface is angled with respect to an insertion direction of the terminal into the housing.

In relative to the conventional technology, the electrical connector defines a slant transitional portion, hence improving a flaw that the terminals can only provide flexibility in one direction. Furthermore, the resistance capability and the durability of the terminals are attained, and the electrical and mechanical connection can be assured.

The present invention is illustrated by way of example and not limitation in the figures of the appended drawings, in which like references indicate identical elements, and in which:

DETAILED DESCRIPTION OF THE EMBODIMENTS

In the following description, for purpose of explanation, numerous details are set forth in order to provide a thorough understanding of the embodiments of the present invention. However, it will be apparent to one skilled in the art that these specific details are not required in order to practice the embodiments of the present invention.

The following description includes terms such as upper, lower, upwardly and the like, that are used for descriptive purpose only and are not to be construed as limiting. That is, these terms are terms that are relative only to a point of reference and are not meant to be interpreted as limitation but are instead, included in the following description to facilitate understanding of the various aspects of the present invention.

Figure 1:
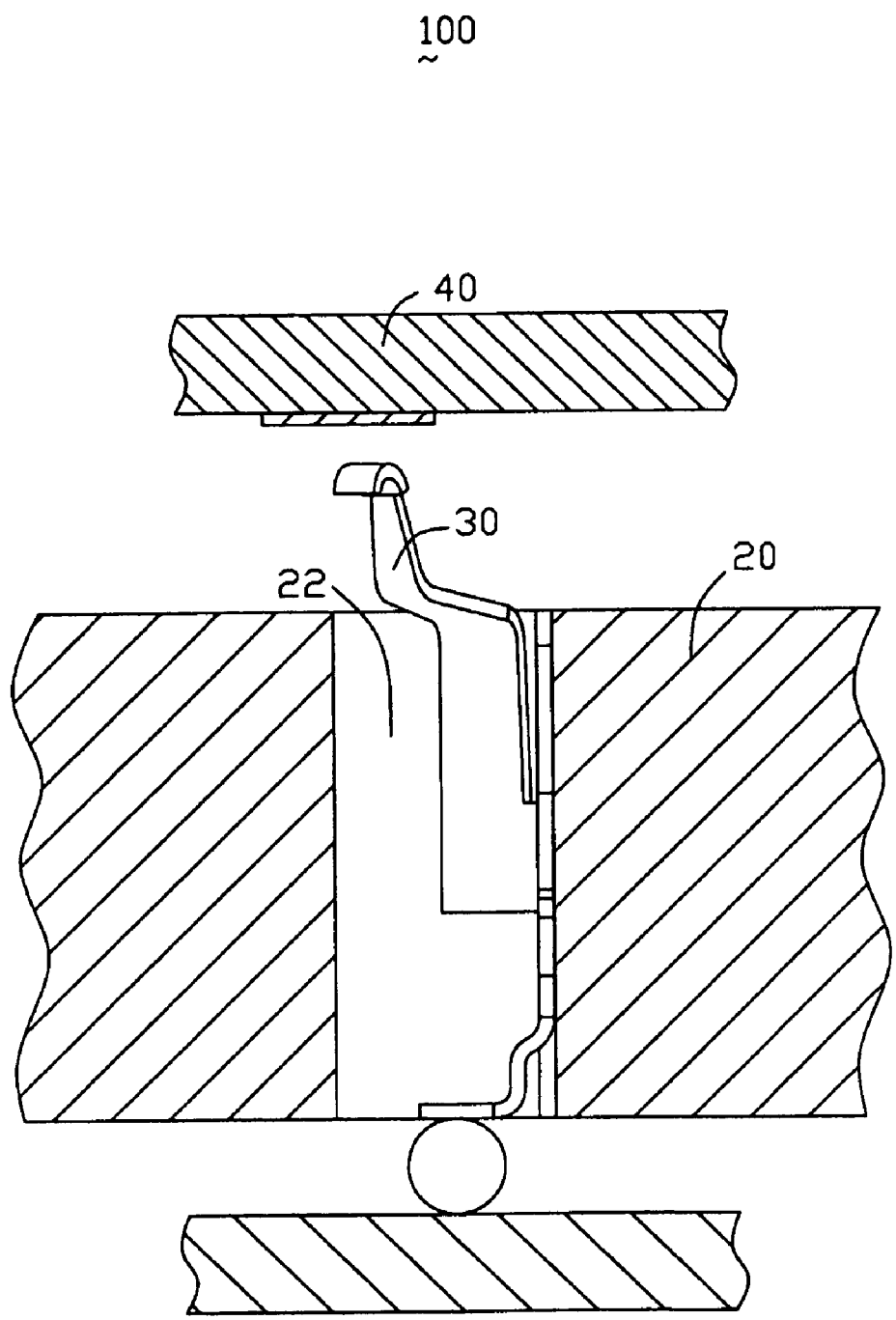
FIG. 1 depicts an exemplary cross-sectional view of a conventional electrical connector, wherein the terminals received in the electrical connector do not contact with a chip module.
Figure 2:
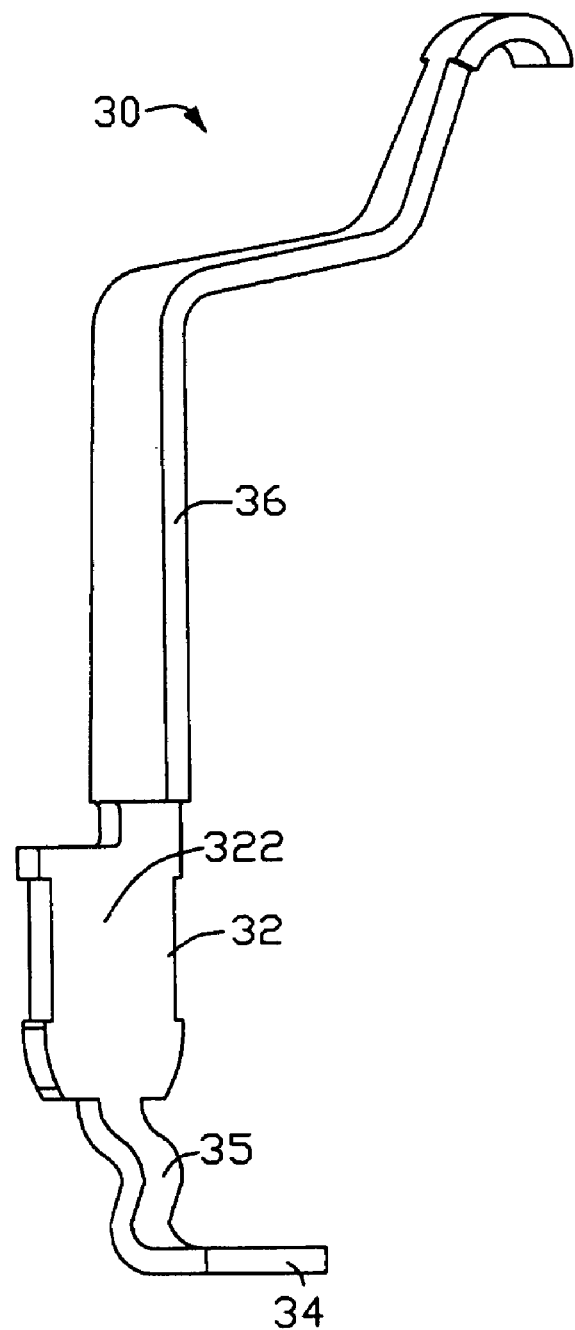
FIG. 2 depicts an exemplary isometric view of a conductive terminal shown in FIG. 1.
Figure 3:
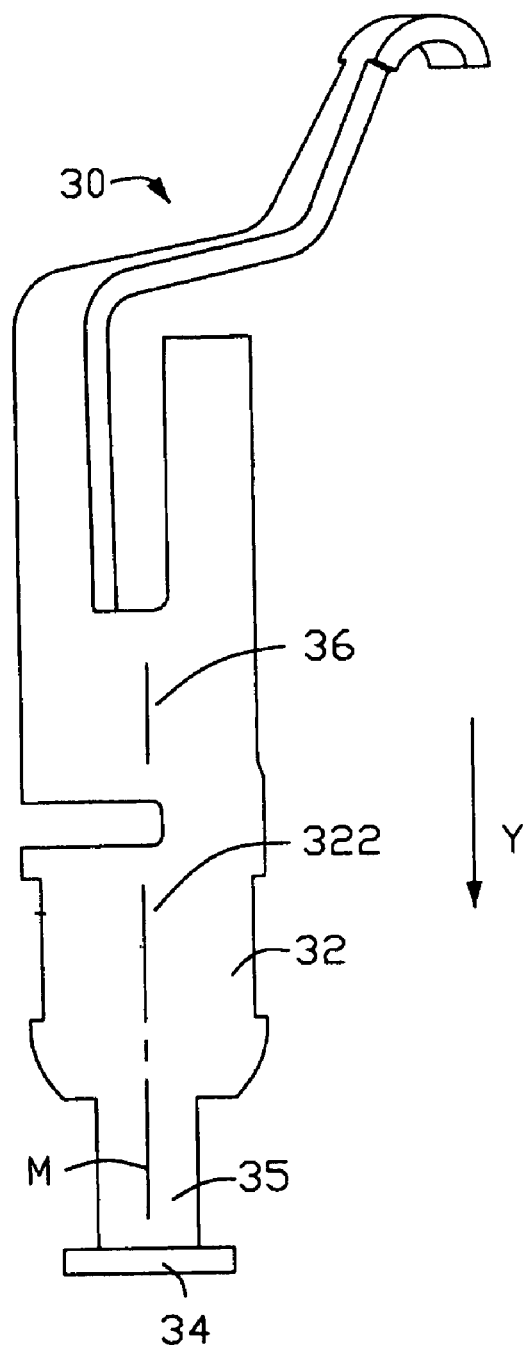
FIG. 3 depicts an exemplary projected view of the terminal shown in FIG. 1.
Figure 4:
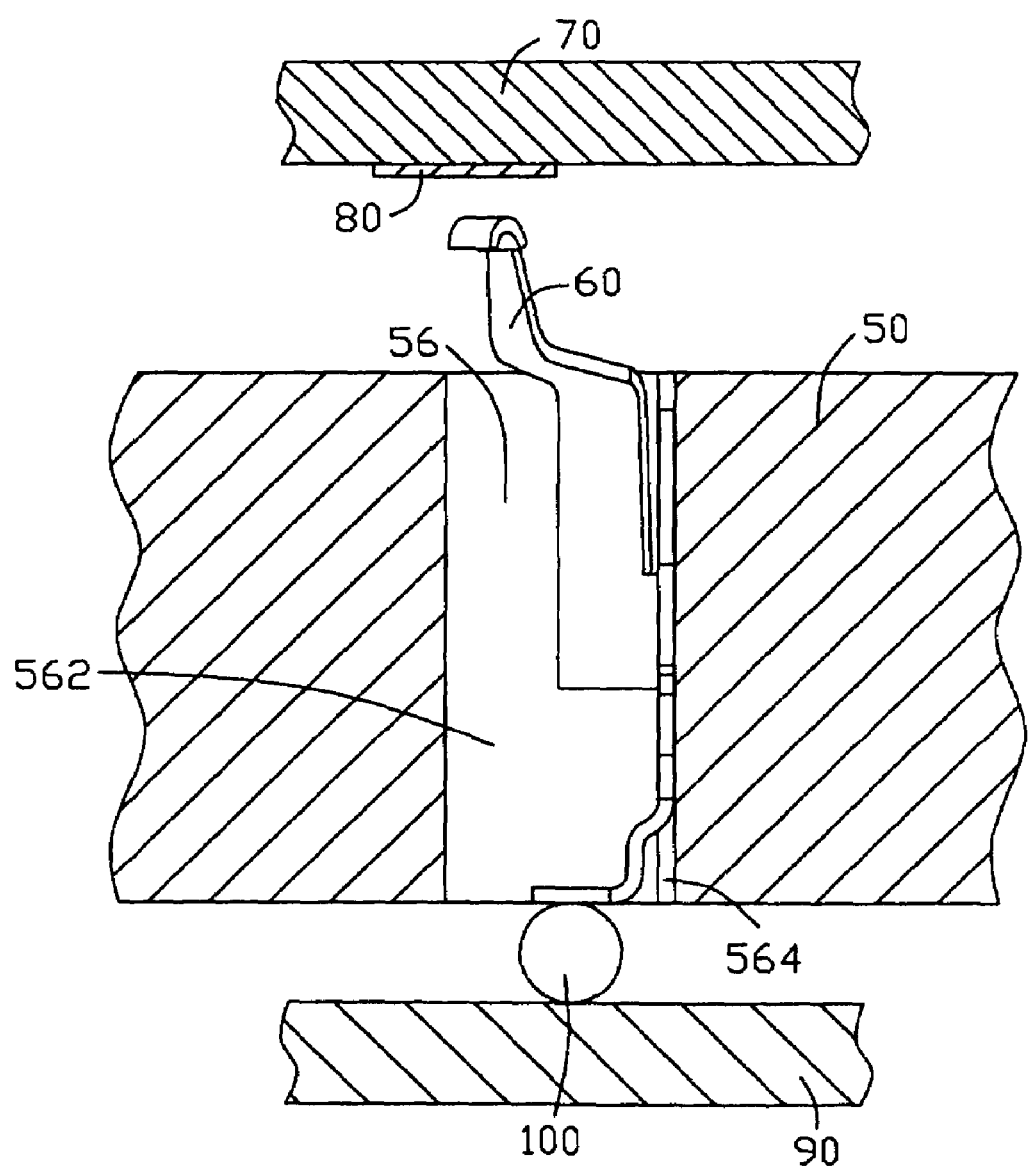
FIG. 4 depicts an exemplary cross-sectional view of an electrical connector of the first embodiment in accordance with the invention, wherein the terminals received in the electrical connector do not contact with a chip module.
Figure 5:
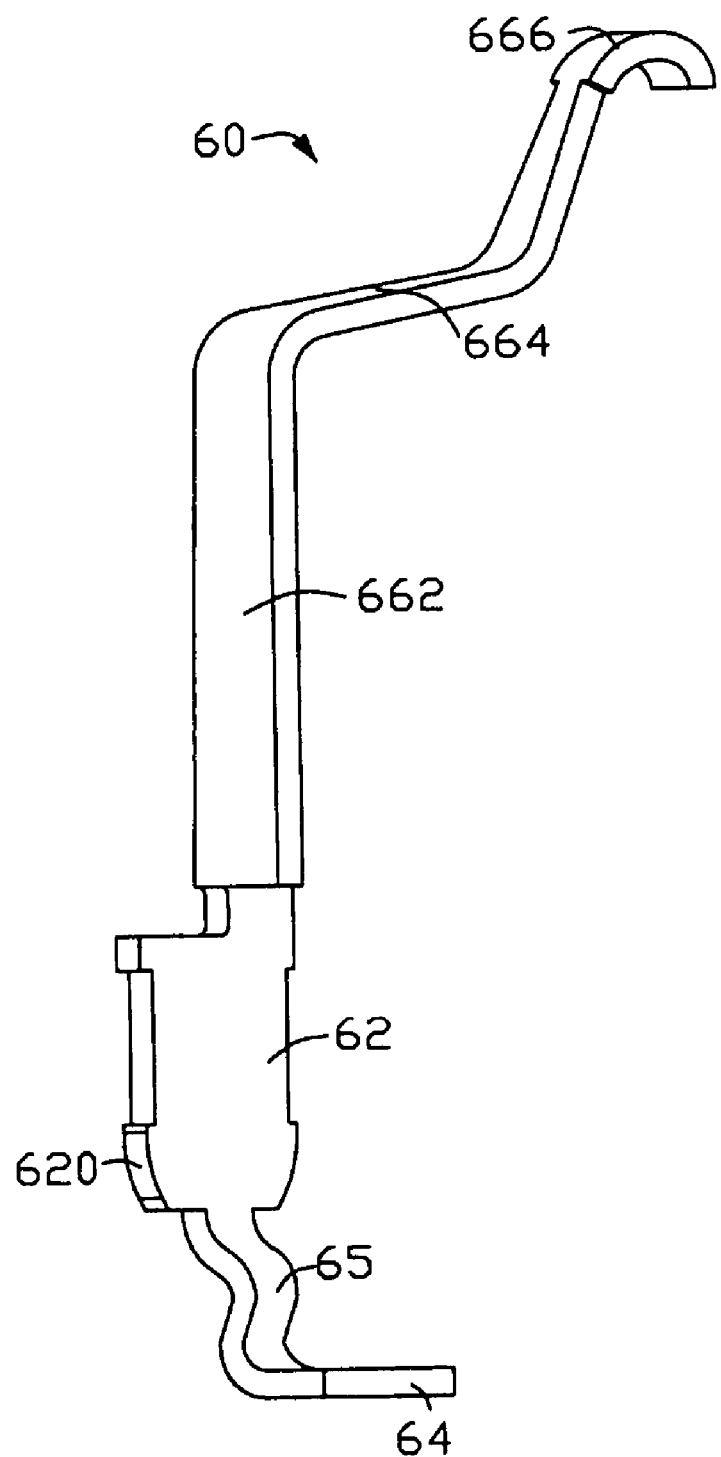
FIG. 5 depicts an exemplary isometric view of a conductive terminal shown in FIG. 4.
Figure 6:
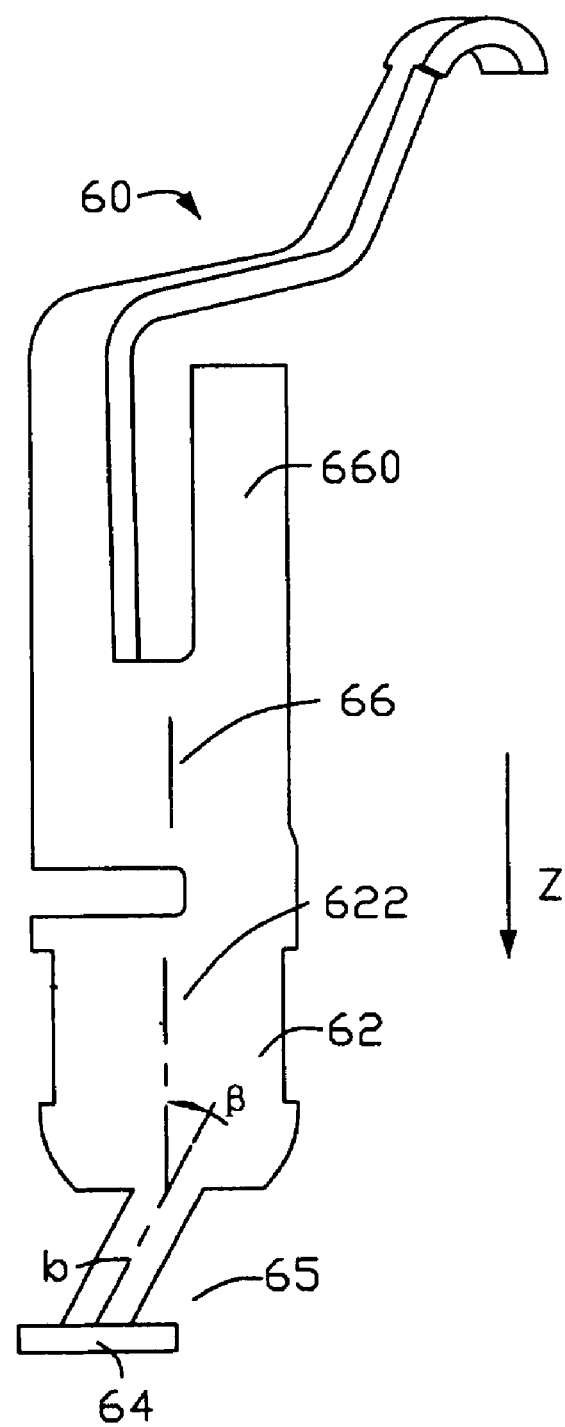
FIG. 6 depicts an exemplary isometric view of the conductive terminal shown in FIG. 5, in another perspective.

Referring to FIGS. 4-6, an electrical connector 200 for connecting a chip module 70 to a printed circuit 90 in accordance with a first embodiment of the present invention includes an insulative housing 50 defining a number of passageways 56 therein and a number of conductive terminals 60 residing in the corresponding passageways 56, respectively.

Individual elements of the electrical connector 200 will now be described in greater detail. The housing 50 includes a supporting surface 52 to accept the chip module 70 thereon and an opposite mounting surface 54 facing to a printed circuit board 70. A number of passageways 56 extending between the supporting surface 52 and the mounting surface 54 are arranged in the housing 50 in a predetermined matrix fashion. The passageway 56 defines a rectangular receiving channel 562 and an elongate securing channel 564 commutated with the receiving channel 562.

As shown in FIG. 5 and FIG. 6, a number of conductive terminals 60 made by stamping and bending are received in corresponding passageways 56, respectively. Each conductive terminal 60 includes a vertical oriented securing section 62 having a number of interfering blocks 620 at two lateral sides thereof for inferentially contacting with inner walls of the securing channel 564, a connecting section 66 extending upwardly from the securing portion 62, and a tail portion 64 extending downwardly from an end of the securing portion 62, for instance a soldering pad, to be mounted on a printed circuit board 90. The securing portion 62 defines a securing surface 622. A curved transitional portion 65 is defined between the tail portion 64 and the securing portion 62. A centerline of the projection that the transitional portion 65 projects on a plane defined by the securing surface 622 is a line b. The direction of the terminals inserted into the housing is direction Z. The centerline b is angular with Z a separation angle β. Furthermore, the width of the different position of the transitional portion can be altered in accordance with resistance capability of the terminals needed.

The connecting portion 66 comprises an engaging portion 660 extending vertically from the securing portion 62, and a retention portion 662 extending from a lateral side thereof, and a cantilever 664 extending arcuately and upwardly from a top end of the retention portion 662. The cantilever 664 defines a contact portion 666 on a top end thereof for contacting with a pad attached to the chip module 70.

In assembly, the terminals 60 are inserted into passageways 56 of the housing 50 from a top side of the housing. The securing portion 62 abuts against sidewalls of passageways 56 so that the interfering blocks 620 of the securing portion 62 engage interferentially with inner surfaces of the securing channel 564, thereby the terminals 60 securing in the passageways 56. The cantilever 664 of the terminal 60 extends beyond the supporting surface 52 of the housing 50 so the top surface of the contact portion 666 abuts against the pad attached on the chip module 70. The tail portion 64 extends beyond the mounting surface 54 of the housing 50 for inserting into the printed circuit board 90 and being soldered thereon. The centerline of the transitional portion 65 projected on a plane defined by the securing surface 622 is a. The direction of the terminals 60 inserted into the housing 50 is Z. The centerline a is separated an angle β with the direction Z, so the transitional portion 65 not only provides a flexibility vertical to the contacting surface between the chip module 70 and the housing 50 but also a flexibility obliquely to this direction thereby improving the drawback of terminals 60 that only provide one direction flexibility and enhancing the stability of the electrical connector 200.

Figure 7:
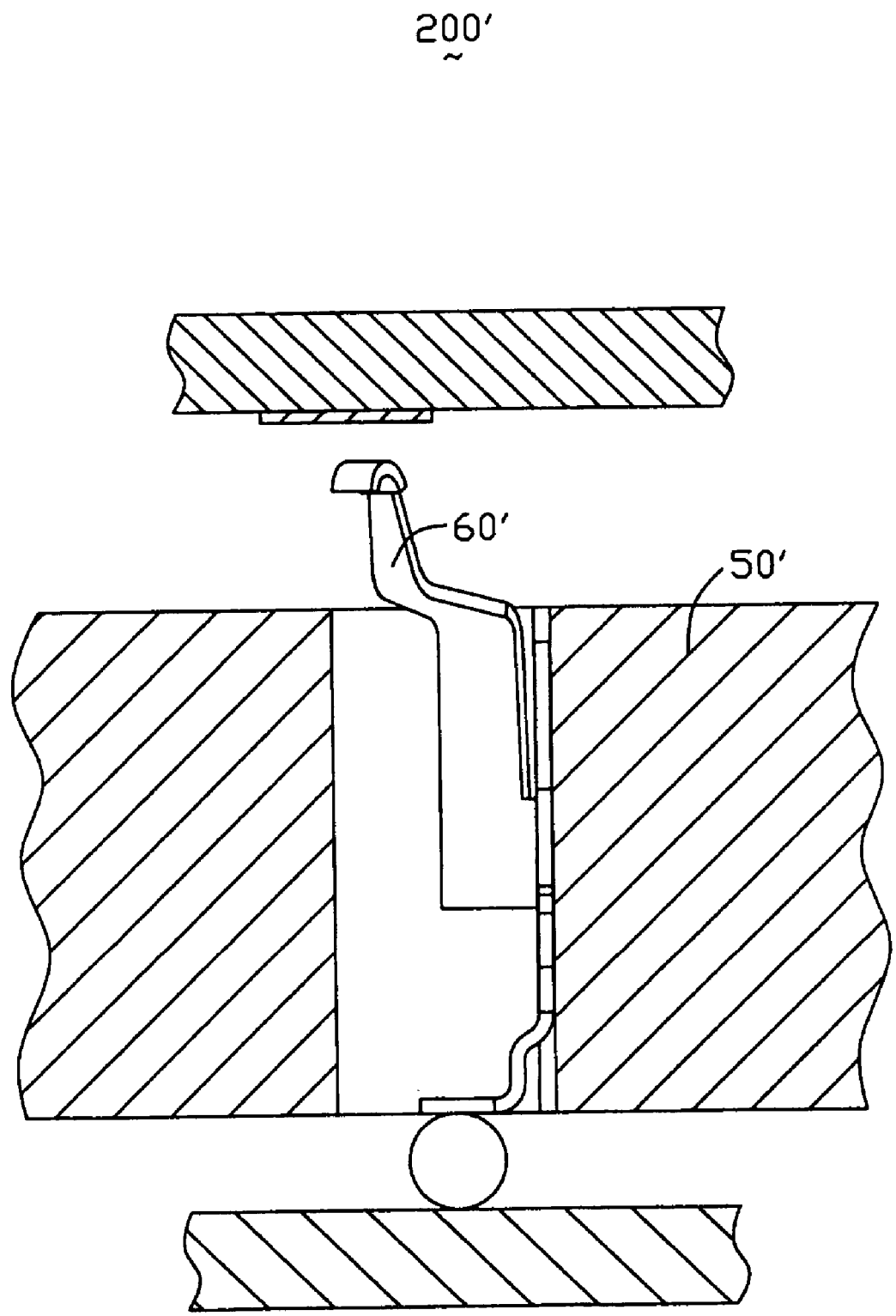
FIG. 7 depicts an exemplary cross-sectional view of an electrical connector of the second embodiment in accordance with the invention, wherein the terminals received in the electrical connector do not contact with a chip module.
Figure 8:
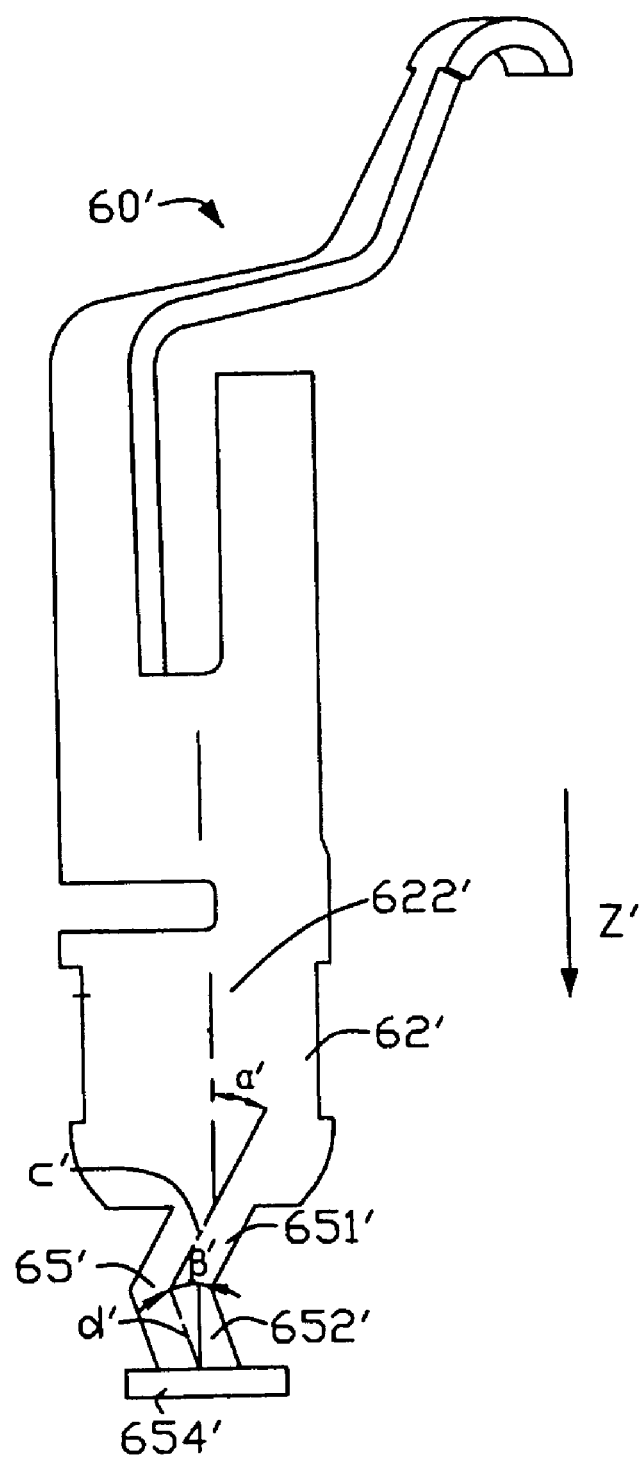
FIG. 8 depicts an exemplary projected view of a terminal received in the electrical connector shown in FIG. 7, projected on a plane defined by the securing surface.

Referring to FIGS. 7-8, an electrical connector 200' of the second embodiment in accordance with the invention comprises a housing 50' and a plurality of terminals 60 received in the housing 50'.

In this embodiment, the terminal 60' comprises a securing portion 62', a connecting portion 66' extending form the securing portion 62' and a tail portion 64 extending form a lower end of the securing portion 62', and a transitional portion 65' formed between the tail portion 64' and the securing portion 62'. The securing portion 62' defines a securing surface 622' and the transitional portion 65' is disposed as two parts comprising a first twist portion 651' and a second twist portion 652'. The centerlines of the first twist portion 651' and the second twist portion 652' projected on the plane of the securing surface defined by are lines c', d'. The inserting direction of the terminals inserted into the housing is direction Z'. The lines c', d' are separated angles α', β' with Z'. So the first twist portion 651' and the second twist portion 652' can improve the flexibility of the terminals 60' and enhance the stability of the electrical and mechanical connection between the terminals 60' and the printed circuit board 70'.

Figure 9:
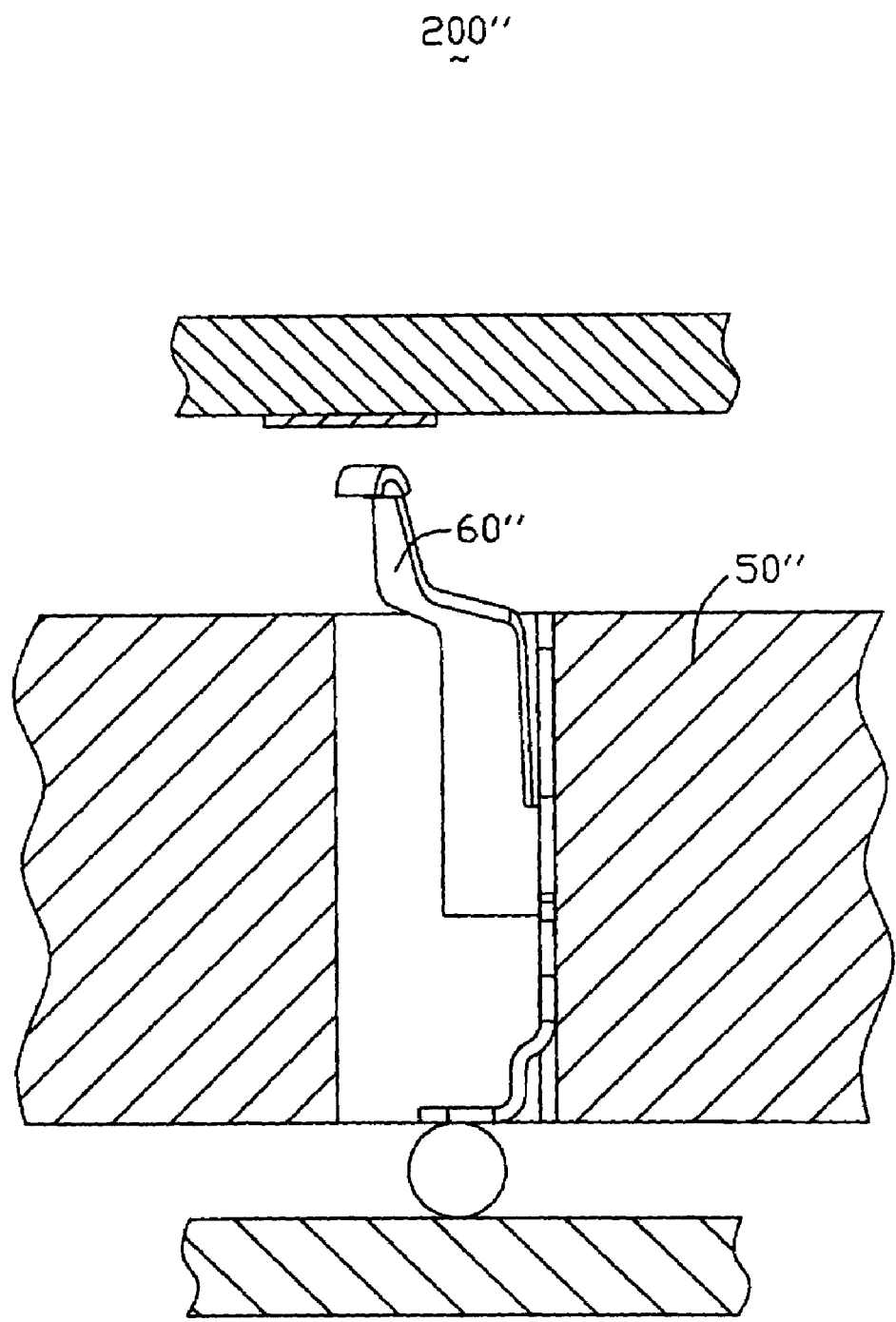
FIG. 9 depicts an exemplary cross-sectional view of an electrical connector of the third embodiment in accordance with the invention, wherein the terminals received in the electrical connector do not contact with a chip module.
Figure 10:
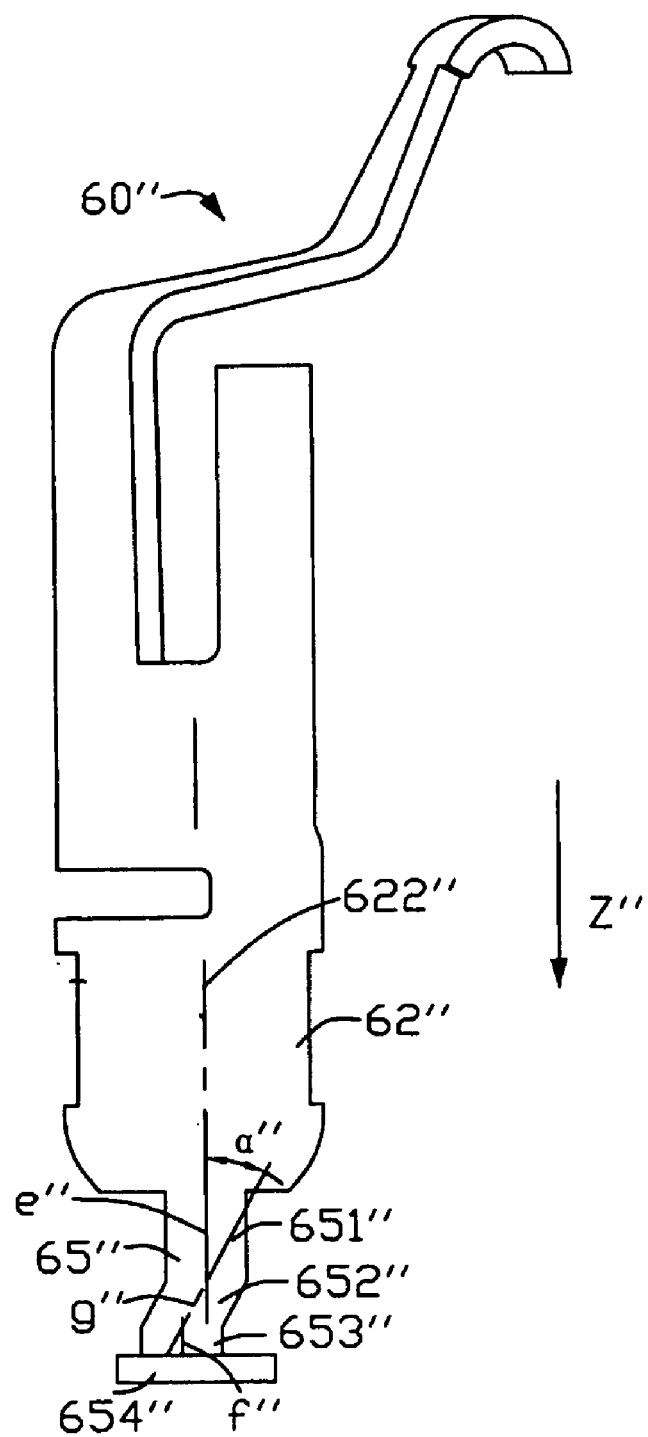
FIG. 10 depicts an exemplary projected view of a terminal shown in FIG. 9, projected on the plane defined by the securing surface.

As illustrated in FIG. 9 to FIG. 10, an electrical connector 200" of a third embodiment in accordance with the invention comprises a housing 50" and a plurality of terminals 60" received in.

In this embodiment, the terminal 60" comprises a securing portion 62", a connecting portion 66" extending form the securing portion 62" and a tail portion 64" extending form a lower end of the securing portion 62", and a transitional portion 65" formed between the tail portion 64" and the securing portion 62". The securing portion 62" defines a securing surface 622" and the transitional portion 65" is disposed as three parts comprising a vertical buffering portion 651", a horizontal buffering portion 653" and a twist portion 652" disposed between the vertical buffering portion 651" and the horizontal buffering portion 653". The centerlines of the vertical buffering portion 651" and the horizontal buffering portion 653" projected on a plane defined by the securing surface 622" are two lines e", f", which are parallel to the direction of the terminals being inserted into the housing. The centerline of the twist portion 652" projected on the plane defined by the securing surface is line g", which is separated an angle α" with the direction of the terminals 60" being inserted into the housing 50". The vertical buffering portion 651" and the horizontal portion 652" can ease the deformation of the transitional portion 653" due to stress concentration and the twist portion 653" can improve the problem of the one direction flexibility.

In connection with the preceding description, the electrical connectors in accordance with embodiments of the present invention can create multi-directional flexibility effect, which possibly optimize electrical and mechanical connection between terminals and the printed circuit board during signal transmission.

While the present invention has been illustrated by description of embodiments thereof, and while the embodiments have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

What is claimed is:

1. An electrical connector for establishing electrical connection between an electronic component and a printed circuit board, the electrical connector comprising:

an insulative housing defining a plurality of passageways; and a plurality of conductive terminals residing in corresponding passageways, respectively, the conductive terminals each comprising:
a securing portion comprising a securing surface; a connecting
portion extending from the securing portion;
a transitional portion extending from a lower end of the securing portion; and
a tail portion extending from the transitional portion;
wherein at least a partial projection of the transitional portion projected on the plane defined by the securing portion is angled with respect to an insertion direction of the terminal into the housing;
wherein the transitional portion is disposed as three parts comprising a vertical buffering portion, a horizontal buffering portion and a twist portion disposed between the vertical buffering portion and the horizontal buffering portion, projections of the vertical buffering portion and the horizontal buffering portion projected on the plane defined by the securing surface are parallel to the inserting direction of the terminals inserted into the housing, projection of the twist portion projected on the plane defined by the securing surface defines a separation angle with the inserting direction of the terminals inserted into the housing.

2. The electrical connector of claim 1, wherein the whole projection of the transitional portion projected on a plane defined by the securing surface forms an angle with the direction of the terminals inserted into the housing.

3. The electrical connector of claim 2, wherein the terminal further comprises a connecting portion from a top end of the securing portion and a retention portion extending from a lateral side of the connecting portion, and a cantilever extending upwardly from an end of the retention portion.

4. The electrical connector of claim 3, wherein the width of transitional portion is predetermined in accordance with a desired flexibility.

5. The electrical connector of claim 4, wherein the securing portion defines a number of blocks on lateral sides thereof.

6. An electrical connector for establishing electrical connection between an electronic component and a printed circuit board, the electrical connector comprising:
an insulative housing defining a plurality of passageways; and
a plurality of conductive terminals residing in corresponding passageways, respectively, the conductive terminals each comprising:
a securing portion comprising a securing surface; a connecting
portion extending from the securing portion;
a transitional portion extending from a lower end of the securing portion; and
a tail portion extending from the transitional portion;
wherein at least a partial projection of the transitional portion projected on the plane defined by the securing portion is angled with respect to an insertion direction of the terminal into the housing;
wherein the transitional portion is disposed as two parts comprising a first twist portion and a second twist portion and projections of the first and the second twist portions projected on the plane defined by the securing surface are separated an angle with the inserting direction of the terminals inserted into the housing.

* * * * *